United States Patent [19]

Baglee et al.

[11] Patent Number: 4,718,041

[45] Date of Patent: Jan. 5, 1988

[54] EEPROM MEMORY HAVING EXTENDED LIFE

[75] Inventors: David A. Baglee, Houston; Michael C. Smayling, Missouri City, both of Tex.

[73] Assignee: Texas Instruments Incorporated, Dallas, Tex.

[21] Appl. No.: 817,382

[22] Filed: Jan. 9, 1986

[51] Int. Cl.⁴ .................................................. G11C 11/34
[52] U.S. Cl. ..................................... 365/185; 365/222
[58] Field of Search ............... 365/104, 185, 218, 222, 365/189

[56] References Cited

U.S. PATENT DOCUMENTS 4,458,348  7/1984  Fukuda et al. ...................... 365/185

Primary Examiner—Joseph A. Popek
Attorney, Agent, or Firm—John G. Graham

[57] ABSTRACT

Disclosed is a method and apparatus for extending the programmable life of an EEPROM memory. For each write commamd generated external to the memory an automatic internal read operation is executed. Each internally generated read operation is accompanied by an increased sense voltage. Data written into selected cells is temporarily stored and compared with the data read. If a match of the compared data is found, the memory operations continue as usual. If a mismatch is found, an internally generated write operation is generated, the programming voltage is increased, and the data temporarily stored is rewritten at the increased voltage. Data polling features are provided with both the internal and externally generated write operations.

21 Claims, 5 Drawing Figures

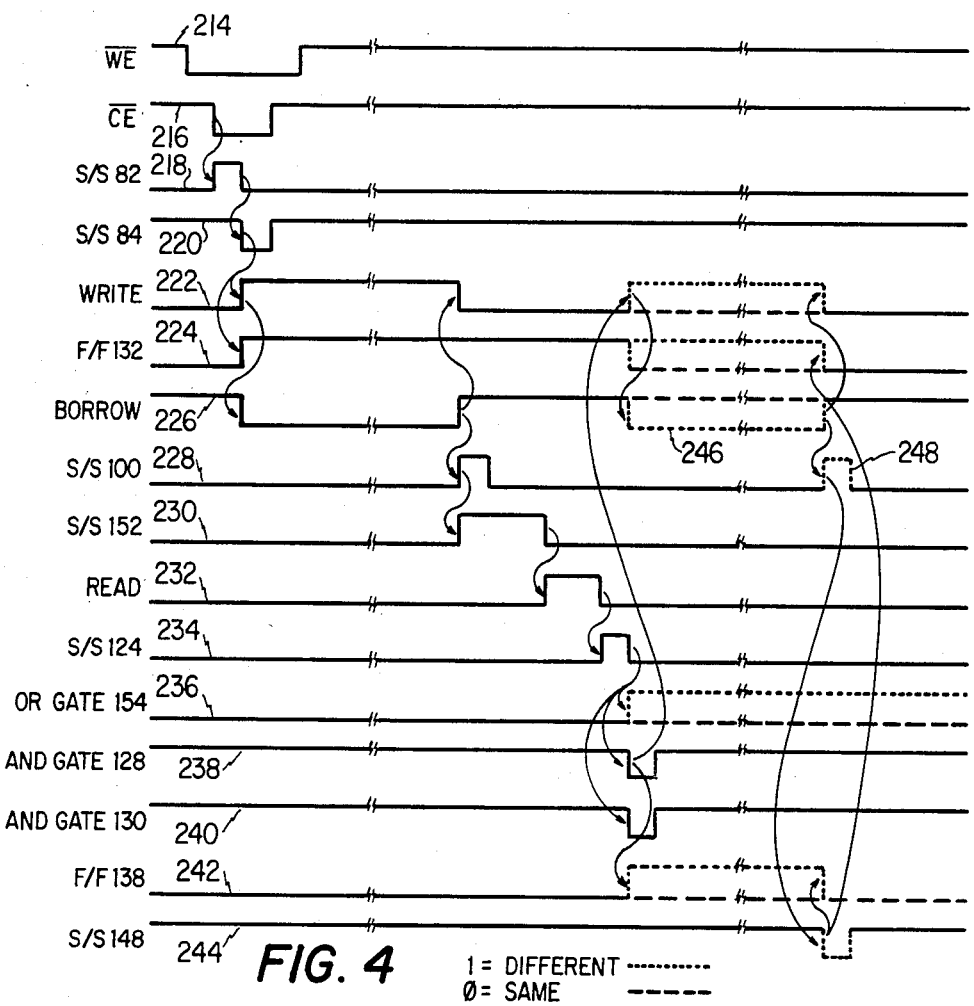
FIG. 4    1 = DIFFERENT ----------
         0 = SAME    ------
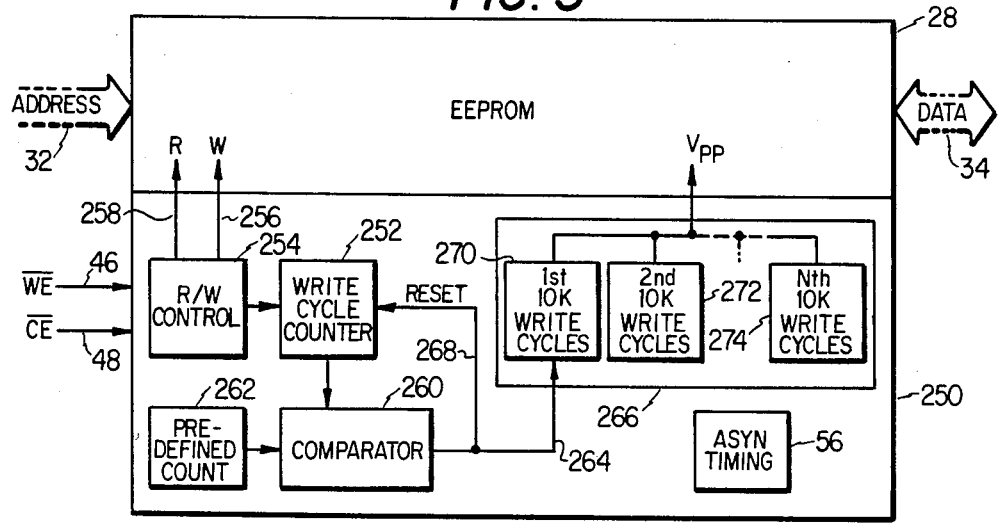
FIG. 5

EEPROM MEMORY HAVING EXTENDED LIFE

TECHNICAL FIELD OF THE INVENTION

The present invention relates in general to semiconductor memories, and more particularly relates to read only memories which are electrically programmable.

BACKGROUND OF THE INVENTION

In many electronic circuit applications, storage devices are needed primarily for reading data stored therein. Such memories, termed read only memories (ROMs), are initially programmed with the desired data, and are rarely reprogrammed thereafter. Commercial 16K and 64K ROM memories are currently available for storing such type of static data.

When the reprogramming of ROM memories is necessary, various techniques are available for writing new data therein. In certain types of ROM memories, the old data can be erased by ultraviolet light, while in more recently developed MOS memories the cells can be quickly electrically erased and reprogrammed. MOS read only memories of the latter type employ a floating gate and an electron tunneling affect for achieving multiple write operations and are termed electrically erasable programmable read only memories (EEPROMS).

While the floating gate type of storage cell greatly facilitates reprogramming, the cell structure deteriorates after a number of programming cycles, thereby reducing the reliability of the memory. Specifically, a very thin oxide layer separates the floating gate of the memory cell transistor from a diffused area in the substrate. After a number of programming or write cycles, a charge accumulates in the tunnel oxide, thereby reducing the effect of the programming voltage on the cell. As a result, the electric field across the oxide is reduced, and the charge transferred to the floating gate is correspondingly reduced. Hence, the programmability of the ROM memory is affected, and the reliability is reduced.

From the foregoing, it may be seem that a need has arisen for an EEPROM memory which can be revitalized after a number of programming write operations. There is a concomitant need for an EEPROM memory in which cell deterioration can be detected, and compensated for without the loss of data information.

SUMMARY OF THE INVENTION

In accordancre with the present invention, a method and circuit are provided which substantially reduce or eliminate the shortcomings associated with prior EEPROM memories.

An improvement in floating gate type of EEPROM memories is provided for extending the programming life thereof, without substantially affecting the normal operation of the memory. Moreover, the circuit is transparent to processing apparatus or peripheral equipment associated therewith. In accordance with the preferred form of the invention, the programming voltage applied to the cells of the EEPROM memory is increased a predetermined amount, once the deterioration of the floating gate oxide has resulted in the faulty writing of the memory.

More particularly, data to be written into the memory is first stored in a buffer latch before being written into the storage cells. The termination of an externally generated write cycle automatically initiates an internal read cycle with an increased sense voltage, wherein the contents of the storage cells are read. A comparator is provided for comparing the data read from the cells with the data stored in the buffer latch to determine if the data was properly written. On an indication by the comparator that there is a disagreement between the data written with that stored in the buffer latch, the programming voltage of the affected cells is increased a predetermined amount before initiating an internally generated write operation of the data. The cells are thus effective to again store data reliably.

In another embodiment of the invention, the number of programming cycles are counted during the life of the EEPROM, and after a predetermined number of such programmings, the programming voltage is automatically increased.

BRIEF DESCRIPTION OF THE DRAWINGS

For a more detailed description of the present invention and for further features thereof, reference is now made to the following description taken in conjunction with the accompanying drawings, in which:

FIG. 4 is a graphical illustration of the timing relationship of various electrical signals generated by the circuit of FIG. 3; and FIG. 5 illustrates a block diagram of an alternative form of the invention.

DETAILED DESCRIPTION OF THE INVENTION

Figure 1:
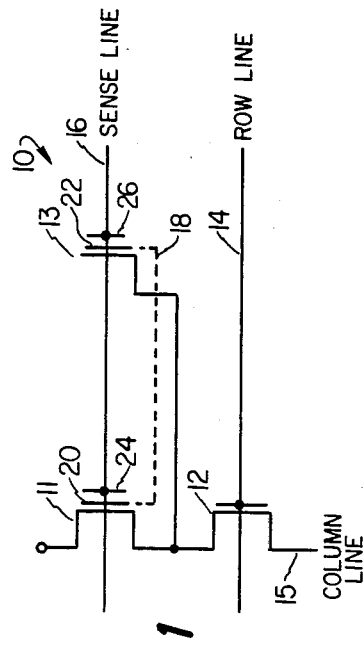
FIG. 1 is a sectional view of a floating gate MOS transistor structure.

Referring to FIG. 1, there is shown a floating gate cell structure 10 which is typically employed in Metal Oxide Semiconductor (MOS) EEPROM memories. The cell structure 10 consists of a sense transistor 11 in series with a row transistor 12, and a write/erase device 13 (actually a tunnel diode), also connected to transistor 12. Each cell structure 10 has a row line 14 and a column line 15 connected in common to other similar lines of corresponding cell structures of a memory array. A sense line 16 is also common with other cell structures in a row of the array. A floating gate segment 18 includes a floating gate 20 of sense transistor 11 and a write/erase electrode 22 for the tunnel diode 13. The sense line 16 forms a gate 24 for the sense transistor 11, and the upper control gate 26 for the tunnel diode device 13.

The sense transistor 11 has a gate oxide layer which, for example, is about 500 angstroms thick compared to the thin gate oxide of device 13 which is about 100 angstroms thick. When a voltage of about 17-20 volts is impressed on the control gate 16, the electric field generated across the thin oxide of electrode 22 causes a tunneling of electrons to the floating gate segment 18. This occurs when writing the memory cell 10. For erasing the cell, the polarity of the voltage is reversed and electrons tunnel from the floating gate segment 18 to the electrode 22.

The presence or absence of electrons on the floating gate segment 18 has an affect on the conduction channel of sense transistor 11. As a result, the storage of a "one" or a "zero" in a MOS memory cell 10 having the described structure can be achieved by storing or removing electrons from the floating gate segment 18. More importantly, the floating gate memory cell 10 is nonvolatile, meaning that power can be removed without destroying the information stored within the cells. Accordingly, floating gate type of memory cells are advantageously used for read-only-memories (ROMs).

As noted above, after a number of write or erase cycles, trapped electrons are accumulated in the thin gate oxide of the tunnel diode device 13. The trapped electrons reduce the effectiveness of the programming voltage impressed across the structure, and thus fewer electrons undergo the tunneling phenomenon. Therefore, the cell becomes "weaker" insofar as it becomes more difficult to distinguish whether a "one" or "zero" was stored. The present invention addresses this problem by increasing the programming voltage once it is determined that one or more cells have deteriorated to the extent that the reliable storage of information is questionable.

Figure 2:
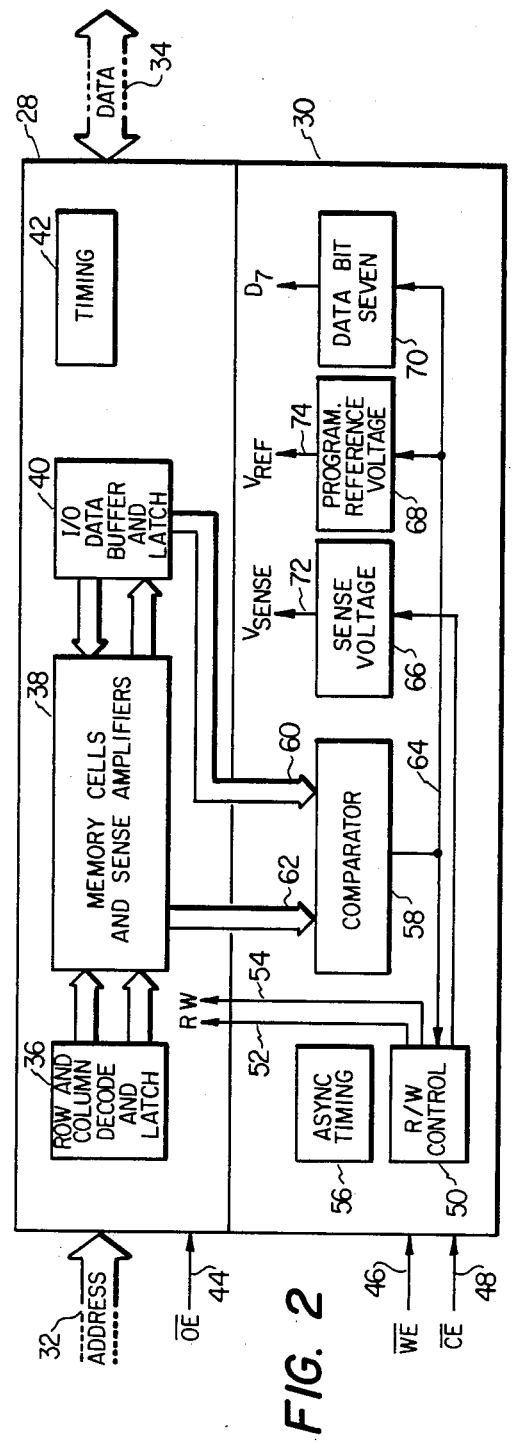
FIG. 2 is a simplified block diagram of an electrically erasable programmable read only memory with the features of the present invention integrated therewith.

There is shown in FIG. 2 an electrically erasable programmable read only memory embodying the features and advantages of the invention. The features of the invention are easily integrated into existing EEPROM memory structures without significantly disturbing the existing design. A conventional EEPROM memory 28 is shown interconnected with circuitry 30 for extending the life of the memory. The EEPROM memory 28 of the invention includes an address bus 32 for selectively accessing a particular memory location, and a bidirectional data bus 34 providing an input/output data port. Data present on the bus 34 is written into a selected memory location, and when the memory is read in accordance with a particular address, data is output on bus 34. An address decoder and latch circuit 36 decodes row and column address information for selectively reading or writing desired memory cells 38. The address information is also latched for subsequent use. An input/output data buffer and latch 40 is also provided for temporarily storing data written into or read out of the memory 28. A timing circuit 42 permits all memory operations to operate in a synchronized manner to effect the storage and retrieval of data information in response to input write and read commands. The foregoing structure constitutes generally an EEPROM memory. An output enable 44 memory input controls the high impedance state of the data bus drivers (not shown in FIG. 2) to thereby provide a bidirectional transmission of data on bus 34.

The circuitry for extending the programming life of the EEPROM memory is shown in block diagram form, and identified generally as reference character 30. A write enable 46 and a chip enable 48 are provided as inputs to the circuit 30. A read/write control circuit 50 is responsive to the write enable 46 and chip enable 48 inputs for providing the EEPROM memory 28 with a read signal 52 and a write signal 54. The read and write inputs 52 and 54 to the memory 28 are effective for causing the storage cells 38 to be read or written with digital information. An asynchronous timing control circuit 56 is also responsive to the write enable 46 and chip enable 48 inputs for providing timing signals to the circuit 30. In accordance with a feature of the invention, the timing control 56 enables the circuit 30 to operate asynchronously with respect to the memory 28. In other words, once the operation of the circuit 30 is invoked, a cycle is completed irrespective of the timing of the memory 28.

A comparator 58 is provided in the circuit 30 for comparing data latched at the input of the memory 28, on a memory bus 60, with memory read from the memory cells 38, on bus 62. The comparator output 64 is coupled to the read/write control 50, as well as to a sense voltage circuit 66, a programming reference voltage circuit 68 and a data polling verification circuit 70. The output 72 of the sense voltage circuit 66 provides a programmable variable sense voltage to the sense lines of the memory 38. The programming reference voltage circuit 68 provides a programmable variable reference voltage 74 impressed across the cells 38 for writing data therein. In actual practice, the reference voltage on line 74 is of a smaller magnitude than the actual programming voltage applied to the cells of the memory 38. Conventional circuitry in the memory 38 amplifies the reference voltage on line 74 to be appropriate level to accomplish the programming of new data into the cells. The polling verification circuit 70 is responsive to a write cycle of the memory to thereby provide other peripheral circuits (not shown) with an indication that the memory 28 is undergoing a memory write operation.

Data polling verification is well known in the art for signaling a host system that read operations should be postponed until the completion of a memory write operation. The signaling to the host system comprises the inversion of data bit number seven ($D_7$). The inversion of $D_7$ can be sensed by the host system by comparing the data initially transmitted to the memory 28 for writing, with the data stored in the I/O buffer and latch 40. During a memory write operation, the memory 28 automatically inverts $D_7$, thereby providing an indication of an ongoing write operation. The utility of the data polling feature can be appreciated in view that the writing of a byte of data in EEPROMs requires about 5 ms, while the reading takes about 150 ns.

The circuit of FIG. 2 operates in the following manner to provide an extended programming life of the memory. It will be assumed that the initial programming or writing of the desired storage cells of the EEPROM memory 28 has been accomplished. In accordance with typical applications of EEPROM memories, the contents of the storage cells are read many times to provide information to a processing system. Occasionally, a write operation of the memory 28 will be conducted to change the information stored within the cells 38. In conventional MOS EEPROM memories, the entire write cycle consumes about five milliseconds. In contrast, and as noted above, a read operation of the memory requires only about 100-200 nanoseconds. Because of the diverse time periods required for the write and read operations of the memory 28, it is apparent that the signaling of the host system of the lengthy write operation is of great utility.

Assuming that the storage cells 38 contain reliable information, a read operation by the host system is conducted by driving the write enable 46 input to a logic high, and the chip enable 48 input to a logic low. Accordingly, the read/write control circuit 50 provides an output signal on read line 52, whereupon the addressed storage cells 38 are read, and the result thereof output on the data bus 34. During externallly generated read operations of the memory 28, no other functions of the circuit are invoked.

A write operation of the memory is accomplished by driving both the write enable 46 input and the chip enable 48 input to logic low levels. The read/write control circuit 50 provides an output write signal to the memory 28 on line 54. In a conventional manner, data appearing on bus 34 is written in selected storage cells 38 in accordance with the address appearing on bus 32. An externally generated write signal activates the timing control circuit 56 for providing the asynchronous operation of the circuit 30. After the write operation, the timing control circuit 56 again activates the read/write control circuit 50, whereupon an internally generated signal is generated on the read signal line 52. As a result, the sense voltage 72 is increased, and data is read from the memory location that was just previously written, which data appears on internal bus 62. The increased sense voltage provides added assurance that the memory cells 38 have stored valid data. Also, the data which was stored in the buffer and latch 40 before writing, also appears on the input latched data bus 60. The comparator 58 compares the data on buses 60 and 62 to determine whether or not the data actually stored is identical to that which was desired to be stored. If a comparison of the data on buses 60 and 62 by comparator 58 indicates equality, the read cycle is terminated without further consequences.

On the other hand, if the comparator 58 detects an inequality of the data on buses 60 and 62, the read/write control circuit 50 automatically generates an internal signal on write line 54. In addition, the comparator 58 triggers the programming reference voltage circuit 68 to provide an increased voltage to assure that the data temporaily stored in the buffer and latch 40 is correctly written into the storage cells 38. For a better understanding of the programming operation of EEPROM memories in general, reference may be made to U.S. Pat. No. 4,628,487 entitled "Dual Slope, Feedback Controlled, EEPROM Programming", and assigned to the Assignee hereof.

Once the internally generated write cycle has been terminated, the timing control 56 resets the read/write control circuit 50, wherein the sense voltage 72 and the programming reference voltage 74 are returned to their previous values.

Figure 3:
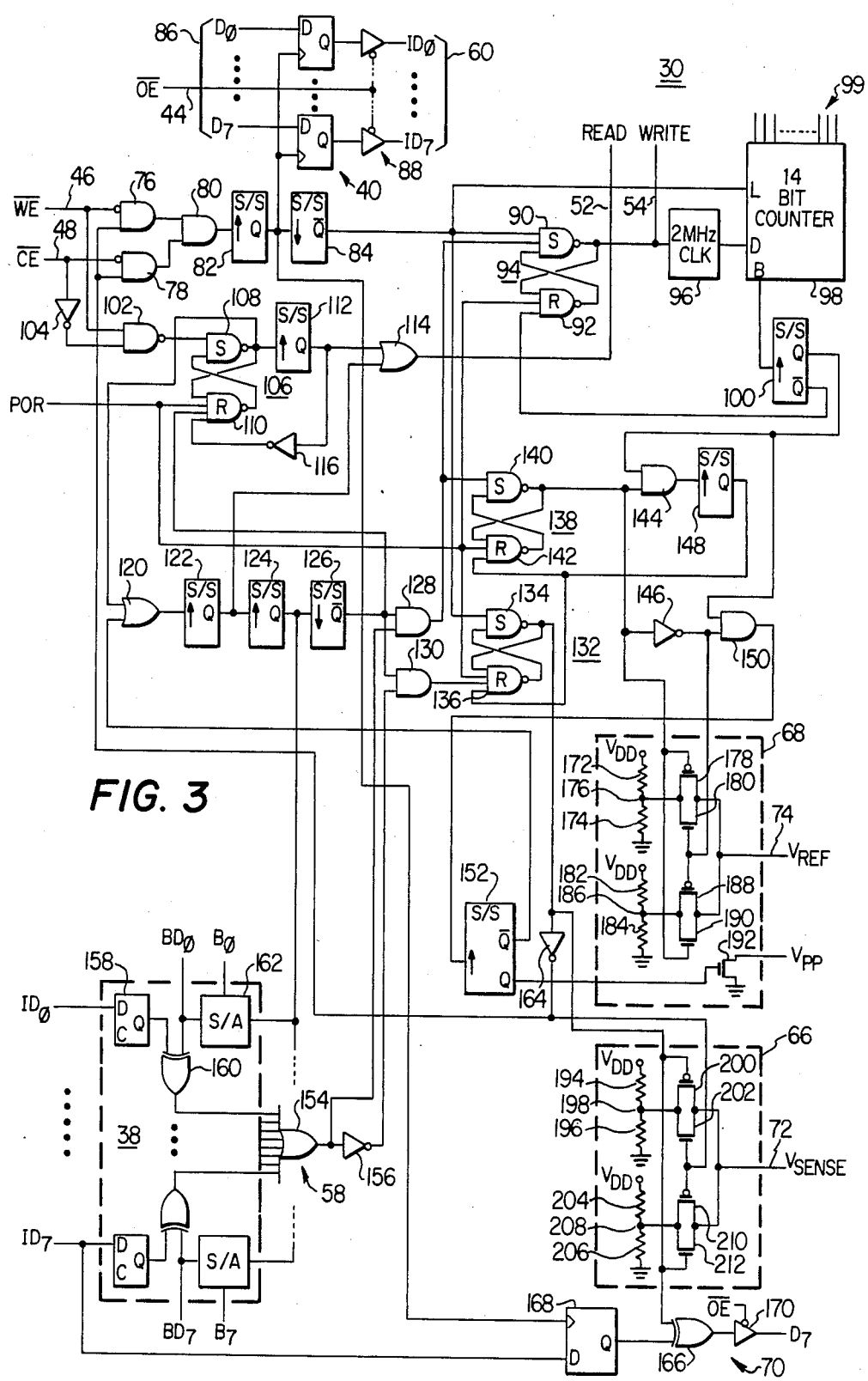
FIG. 3 is a detailed electrical schematic drawing of the invention.

Having described the general characteristics of the invention, reference is now made to FIGS. 3 and 4 for a detailed description of the operation of the invention. Like and corresponding elements shown in FIG. 3 will bear the same reference characters depicted in FIG. 2. In connection with the structure of the circuit 30 for extending the programming life of an EEPROM memory, the write enable 46 and chip enable 48 inputs are coupled to inverting inputs of a pair of AND logic gates 76 and 78, the outputs of which are coupled to a two-input AND logic gate 80. The output of the AND gate 80 is connected to the rising-edge transition input of a single shot monostable 82. The Q output of the monostable 82 is connected to the falling-edge transition input of single shot 84. The Q output of single shot 82 is also coupled to the clock inputs of a plurality of buffer and data latches 40. Data appearing on bus 86 is latched in latches 40 on the occurrence of the output signal of single shot 82. The output enable 44 input is coupled to the high impedance input of a plurality of buffers 88. The Q output of each data latch 40 is coupled to the input of a respective buffer 88.

The $\overline{Q}$ output of single shot 84 is coupled to the set input of a pair of cross-coupled NAND gates 90 and 92, forming flip-flop 94. The output of the flip-flop 94 comprises the write line 54, and the flip-flop 94 is termed the write flip-flop. The output of the Write flip-flop 94 is also coupled to the enable input a 2 megahertz clock 96. The output of the clock 96 is applied to the "down" input of a 14-bit counter 98. The $\overline{Q}$ output of the single shot 84 is also coupled to the "load" input of the counter 98. The borrow "B" output of counter 98 is connected to the rising-edge transition input of a single shot 100.

The write enable 46 input is also connected to one input of a two-input NAND gate 102, and the chip enable 48 input, after being inverted by inverter 104, is connected to the other input of the NAND gate 102. The output of the NAND gate 102 is coupled to the set input of a flip-flop 106 comprising a pair of cross-coupled NAND gates 108 and 110. Flip-flop 106 is termed the read flip-flop. The Q output of read flip-flop 106 is connected to the rising-edge transition input of a single shot 112. The output of the single shot 112 is connected to one input of a two-input OR gate 114. The Q output of single shot 112 is connected to an inverter 116, the output of which is connected back to the reset input of the read flip-flop. The output of OR gate 114 comprises the read line 52 for reading the memory cells 38.

A Power-On-Reset (POR) input 118 signal is coupled to the reset input of the read flip-flop 106. The set output of the read flip-flop 106 is coupled to one input of an OR gate 120. The output of the OR gate 120 is applied to the rising-edge transition input of a single shot 122. The Q output of single shot 122 is connected to an input of OR gate 114. The Q output of single shot 122 is also coupled to the rising-edge transition input of single shot 124. The $\overline{Q}$ output of single shot 124 is, in turn, coupled to the falling-edge transition input of single shot 126. The Q output of single shot 126 is coupled to an input of a pair of AND gates 128 and 130, as well as to the reset input of the read flip-flop 106. The output of AND gate 130 is coupled to the reset input of sense voltage circuit flip-flop 132 comprising a pair of cross-coupled NAND gates 134 and 136. The output of AND gate 128 is coupled to the set input of the write flip-flop 94, as well as to the set input of a programming reference voltage flip-flop 138, comprising a pair of cross-coupled NAND gates 140 and 142.

The Power-On-Reset input 118 is also coupled to the reset input of the program reference voltage flip-flop 138, the reset input of the sense voltage flip-flop 132, and the reset input of the write flip-flop 94. The Q output of single shot 100 is also coupled to an input of an AND gate 144. The set output of the programming reference voltage flip-flop 138 is coupled to the other input of the two-input AND gate 144, as well as to the input of an inverter 146, and to the programming reference voltage circuit 68. The output of AND gate 144 is coupled to the rising edge transition input of single shot 148. The $\overline{Q}$ output of single shot 148 is applied to the reset inputs of the sense voltage flip-flop 132 and the programming reference voltage flip-flop 138. The output of inverter 146 is connected to the programming reference voltage circuit 68, as well as to one input of a two-input AND gate 150. The other input of AND gate 150 is connected to an input of AND gate 144, as well as to the Q output of single shot 100. The $\overline{Q}$ output of single shot 100 is connected to the reset input of the write flip-flop 94. The output of AND gate 150 is coupled to the rising edge transition input of a single shot 152. The $\overline{Q}$ output of single shot 152 is coupled to the other input of OR gate 120. The Q output of single shot 152 is coupled to an input of the programming reference voltage circuit 68.

The comparator 58 is constructed with an 8-input OR logic gate 154, the output of which is connected to an inverter 156. The output of OR gate 154 is coupled to an input of AND gate 128, while the output of inverter 156 is coupled to the input of AND gate 130. Each of the eight inputs of OR gate 154 is associated with a data bit of the memory data bus 62. For example, bit zero $ID_0$ of the input latched data bus is connected to the D-input of latch 158. The Q output of latch 158 is connected to one input of a two-input exclusive OR gate 160. Bit zero $B_0$ output from the memory 38 is applied to a sense amplifier 162, the output of which is coupled to the other input of exclusive OR gate 160. The output of the sense amplifier, i.e., $ED_0$ is also directed to the output of the data buffer. The other data bits, $ID_1$–$ID_7$ and memory bits $B_1$–$B_7$ are comparably processed, and coupled to respective inputs of the comparator OR gate 154.

The set output of the sense voltage flip-flop 132 is connected to an inverter 164, as well as to an input of the sense voltage circuit 66. The output of inverter 164 is also connected to an input of the sense voltage circuit 66, as well as to an input each of AND gates 76 and 78. The input of inverter 164 is also connected to an input of a two-input exclusive OR gate 166. Data bit $ID_7$ is connected to the D-input of a latch 168, the Q output thereof being connected to the other input of exclusive OR gate 166. The clock input of the latch 168 is connected to the Q output of single shot 82. The output of the exclusive OR gate 166 is coupled to a buffer driver 170. The output of the buffer is data bit seven of the data bus 34. The high impedance state of buffer driver 170 is controlled by the output enable signal 44.

The variable programming reference voltage circuit 68 comprises series resistors 172 and 174 connected between VDD and ground. The junction 176 of the resistors 172 and 174 is connected to the drain of a PMOS transistor 178 and to the source of an NMOS transistor 180. The respective source and drain terminals of the transistors 178 and 180 are connected together and to the Vref output 74. Provided also is another pair of series connected resistors 182 and 184, also connected between VDD and ground. The junction 186 of the resistors 182 and 184 is connected to the drain of PMOS transistor 188 and the source of NMOS transistor 190. The source of PMOS transistor 188 is connected to the drain of NMOS transistor 190, and is also connected to the output Vref 74. The programming circuit output Vpp 74 is also connected to the drain of an NMOS transistor 192. The source of transistor 192 is grounded. The gate of transistor 192 is connected to the Q output of single shot 152. The gate of transistor 180 is connected to the gate of transistor 188, the combination being connected to the output of inverter 146. The gates of transistors 178 and 190 are connected together, and to the input of inverter 146. Since Vpp (max) is proportioned to Vref, controlling Vref also controls Vpp.

The sense voltage circuit 66 comprises a pair of series-connected resistors 194 and 196, connected between VDD and ground. The junction 198 of the resistors 194 and 196 is connected to the drain of a PMOS transistor 200, and to the source of an NMOS transistor 202. The source of PMOS transistor 200 and the drain of NMOS transistor 202 are connected together and to the Vsense output 72 of the sense voltage circuit 66. Also provided are series-connected resistors 204 and 206 connected between VDD and ground. The junction 208 of resistors 204 and 206 is connected to the drain of a PMOS transistor 210 and the source of an NMOS transistor 212. The source of PMOS transistor 210 and the drain of NMOS transistor 212 are connected together, and to the output Vsense 72. The gate of NMOS transistor 202 is connected to the gate of PMOS transistor 210, and the combination is connected to the output of inverter 164. The gate of PMOS transistor 200 is connected to the gate of NMOS transistor 212, and the combination is connected to the input of inverter 164.

The operation of the circuit 30 for extending the programmable life of an EEPROM memory 28 is described below. The understanding of the invention illustrated in FIG. 3 is facilitated by reference to the waveforms of FIG. 4. Waveforms 214 and 216 correspond to the signals applied to the write enable 46 input and the chip enable 48 input. Waveform 218 represents the Q output of single shot 82. Waveform 220 corresponds to the $\overline{Q}$ output pulse of single shot 84. Waveform 222 corresponds to the single output by the write flip-flop 94, which is equivalent to the signal on write line 54. Waveform 224 is a waveform representative of the electrical output of the sense voltage flip-flop 132. Waveform 226 represents the borrow output of the counter 98. The pulse illustrated by waveform 228 is the electrical output of the Q output of single shot 100. The waveform 230 corresponds to the electrical output of the Q output of single shot 152. Waveform 232 is the read signal 52, which is taken from the output of OR gate 114. Waveform 234 is the electrical output of the single shot 124. Waveform 236 is the electrical output of comparator OR gate 154. The pulse of waveform 238 corresponds to the electrical output of AND gate 128. The pulse of waveform 240 is representative of the electrical output of AND gate 130. The waveform 242 depicts the output electrical state of inverter 146. Lastly, waveform 244 illustrates the electrical output of the Q output of single shot 148.

An externally generated read cycle is initiated by driving the chip enable 48 input low, and the write enable 46 input high. NAND gate 102 thus sets read flip-flop 106 which then triggers single shot 122. The Q output of single shot 112 is coupled through OR gate 114 and generates a memory read signal on line 52. As a result, the addressed cells 38 of the memory 28 are read and output on data bus 34. The read flip-flop 106 is reset by the single shot signal, as inverted by inverter 116.

A typical write operation is conducted as follows. When the write enable 46 and chip enable 48 inputs are driven to the logic levels shown in FIG. 4, the outputs of AND gates 76 and 78 are both high, thus driving the output of AND gate 80 high. The single shot 82 is thus triggered providing output pulse 218. Pulse 218 latches data bits $D_0$–$D_7$ into the corresponding latches 40. In addition, pulse 218 latches data bit $ID_7$ into latch 168. Because of the power-on-reset 118 of the sense voltage flip-flop 132, the logic low applied to one input of the exclusive OR gate 166 enables the inversion of data bit $ID_7$. Buffer 170 drives data bit 7 ($D_7$) on the output data bus 34, thereby signaling the host system of the involvement of a write cycle. Pulse 218 generated by single shot 82 also triggers single shot 84, whereupon waveform 220 is generated. The pulse of waveform 220 sets the write flip-flop 94, and in addition, loads counter 98 with a predetermined count corresponding to the logic state on input 99. In the preferred embodiment of the invention, the counter 98 is loaded with a count equal to 10,000. When toggled by the two megahertz clock signal, approximately five milliseconds are consumed in counting downwardly to zero.

The setting of write flip-flop 94 produces a signal on write line 54 for instituting the writing of data then stored in the data buffer and latch 40 into a selected memory word location. Also, the setting of write flip-flop 94 enables the output of the two megahertz clock 96 to be applied to the "down" input of the counter 98. After the counter 98 has counted to the binary zero output state, a borrow on the "B" output is generated, which borrow signal triggers single shot 100. As noted above, the writing of the memory 28 takes about 5 ms, thus the borrow output signal is generated after such writing. The counter 98 can thus be considered as a delay element.

The setting of sense voltage flip-flop 132 is accomplished concurrently with the setting of write flip-flop 94 by the pulse of waveform 220. The set output of the sense voltage flip-flop 132 is inverted by inverter 164 and a low is applied to the pair of AND gates 76 and 78. Thus, subsequent read and write commands are locked out during an ongoing memory operation. A logic high and a logic low are also applied to the sense voltage circuit 66 by inverter 164. The logic high drives NMOS transistor 212 into conduction, and the logic low drives PMOS transistor 210 into conduction. Accordingly, the voltage at the junction 208 of resistors 204 and 206 is supplied to the Vsense output 72. Importantly, resistors 204 and 206 have values which provide a voltage at the junction 208 which is greater than the voltage existing at the junction 198 formed by resistors 194 and 196. In the preferred form of the invention, the sense voltage derived from resistors 204 and 206 is approximately 2.4 volts, whereas the sense voltage appearing at the junction 198 of resistors 194 and 196 is approximately 2.2 volts. Therefore, on the generation of a write cycle, the sense voltage is increased by about 0.2 volts. This increase in the sense voltage provides an added degree of assurance in the subsequent read cycle in determining whether the data written into the memory 28 is identical to that intended to be written.

The externally generated write is conducted with a programming voltage Vpp of a conventional magnitude. The programming reference voltage circuit 68 include resistors 172 and 174 with values which provide a reference voltage Vref of about 2.1 volts. This produces a voltage Vpp (max) of about 17 V. The reference voltage which appears at the junction 176 of resistors is coupled, during an externally generated write cycle, by transistors 178 and 180 to the Vref output 74. This is a result of the resetting of the programming voltage flip-flop 138. A logic low is thus applied to the gate of PMOS transistor 178, and a logic high is applied to the gate of NMOS transistor 180. Accordingly, data bits $D_0$–$D_7$ are written in the addressed location of the memory 28 at a programming voltage Vpp of about 17 volts.

Continuing with the description, after the externally generated write has been completed, the counter 98 generates a borrow signal as shown by waveform 226 of FIG. 4. As noted above, the rising edge of the borrow signal 226 triggers single shot 100 which, in turn, couples a pulse through AND gate 150 to single shot 152. Single shot 152, being triggered, gives rise to two events. First, the Q output thereof drives transistor 192 of the programming voltage circuit 68 into conduction for discharging the programming voltage line $V_{pp}$. Secondly, the signal appearing at the Q output of the single shot 152 is coupled through OR gate 120 for triggering single shot 122. As a result of the latter event, a signal is generated on read line 52 through OR gate 114. The read operation of the selected memory cells is conducted using the increased sense voltage Vsense generated by resistors 182 and 184.

The output pulse generated by single shot 122 also triggers single shot 124, thus generating the sense latch signal shown in waveform 234 of FIG. 4. The selected data read out of the memory cells 38 is thereby latched within the sense amplifiers 162. The output of each sense amplifier 162 of the memory 28 is compared by the exclusive OR gate 160 with the input data latched in latch 158. If the input data of each data bit matches the respective data bit read from the memory, the output of the exclusive OR gate 160 will be a logic low. If a match does not exist, the output of the exclusive OR gate 160 will be a logic high. This comparison is carried out for each data bit $B_0$–$B_7$ of the memory 28, with the input latched data bits $ID_0$–$ID_7$. In the event that the match exists between all the data bits $B_0$–$B_7$ read from the memory, with the input data $ID_0$–$ID_7$, all inputs to the comparator OR gate 154 will be at a logic low level. The output of OR gate 154 will thus be a logic low, and when inverted by inverter 156, a logic high will be applied to AND gate 130.

The triggering of single shot 124 produces an output pulse which also triggers single shot 126. This produces two events. First, the read flip-flop 106 is reset, if it was not already reset. Secondly, the logic low pulse produced by the single shot 126 is coupled through AND gate 130, thereby resetting the sense voltage flip-flop 132. By the resetting flip-flop 132, the normal sense voltage established by resistors 194 and 196 is coupled to the sense voltage circuit output 72.

With reference again to the digital comparison of comparator 154, if one or more of the bits $B_0$–$B_7$ read from the memory 28 is found to be different from the input data bits $ID_0$–$ID_7$, the output of OR gate 154 will be a logic high. The output of inverter 156 will be driven to a corresponding logic low. In this event, the pulse generated by single shot 126 will be coupled through AND gate 128, whereupon the write flip-flop 94 will be set. As a result, an internally generated write signal will be generated on line 54, and the memory 28 will undergo another write cycle. The pulse generated by single shot 126 is also coupled through AND gate 128 and sets the programming voltage flip-flop 138. A 2.3 volt reference voltage generated by resistors 182 and 184 will thereby be coupled by transistors 188 and 190 to the output Vref 74 of the programming reference voltage circuit 68. This gives a Vpp (max) of about 18 V. Accordingly, the internally generated write cycle will write the memory 28 utilizing a higher programming voltage than that generated by resistors 172 and 174. The resistors 182 and 184 are selected such that the voltage at the junction 186 thereof is about six percent higher than the normal programming voltage generated by resistors 172 and 174.

As a consequence of the setting of the write flip-flop 94, the two megahertz clock 96 is started and the 14-bit counter 98 begins its down count, wherein after about five milliseconds the counter 98 borrow output is generated. The second borrow output generated in response to the internal-generated write signal is shown in FIG. 4 by reference character 246. On the rising edge transition of the second borrow signal 246, single shot 100 is again triggered to produce a positive signal 248. This positive signal is coupled through AND gate 140 and triggers single shot 148. The output signal of single shot 148 resets both the programming reference voltage flip-flop 138 and sense voltage flip-flop 132. With by the inversion of the sense voltage flip-flop output by inverter 164, the pair of AND gates 76 and 78 are again enabled for receiving externally generated read or write signals. The resetting of the sense voltage flip-flop 132 also applies a logic low to exclusive OR gate 166, thereby coupling ID$_7$ to the output without inversion. The host system is thus signalled that a write operation is not in progress. In addition, at the termination of the internally generated write signal, the signal generated at the $\bar{Q}$ output of single shot 100 resets the write flip-flop 94. The circuit for extending the programmable life of an EEPROM memory is thus readied for an externally generated read or write commands.

It is significant to note from the foregoing that the programming reference voltage flip-flop 138 is reset after each internally generated write cycle, thereby restoring the reference voltage Vref 74 to the normal voltage output. As a consequence, the programming reference voltage is increased only during those write cycles in which it was found that the cells did not store the identical data corresponding to that input to the memory 28. Therefore, subsequent externally generated write operations to the memory 28 utilize the normal programming voltage level. During any subsequent write operation, if it is found that a data bit was inadequately stored within a cell, the internally generated write operation will rewrite the whole byte of data using the increased programming voltage.

In the embodiment disclosed, the circuit for extending the programmable life of the EEPROM memory is easily added to the present designs of EEPROM memories. This is because the circuit 30 is provided with its own timing signals, and thereby operates asynchronously with the memory. While various clock signals from the memory 28 could be used to provide synchronous timing signals to the disclosed circuit 30, such an arrangement would require a higher degree of circuit integration with the memory.

FIG. 5 illustrates an alternative embodiment of the invention, wherein the programming voltage is automatically increased after the execution of a predetermined number of write cycles. In EEPROM memories of the type having floating gate storage cells, it has been found that such a memory can undergo about ten thousand write operations before significant deterioration of the cells. Therefore, in the embodiment of FIG. 5, the circuit 250 for increasing the programmable life of the memory 28 includes a write cycle counter 252 for counting the number of write operations generated by a read/write control circuit 254. The read/write control circuit 254 is responsive to signals on the write enable 46 input and the chip enable 48 input for generating signals on read and write lines 256 and 258 in accordance with externally generated commands.

The count in the counter 252 is incremented each time the memory 28 is written. In this embodiment, there are not internal generated read or write cycles, as was performed in the embodiment of FIG. 3. A comparator 260 is provided with a first input coupled to the write cycle counter 252, and a second input coupled to a predefined count. The comparator 260 compares the binary counts on both inputs, and provides an output 264 to a programming voltage circuit 266 on finding equality between the predefined count 262 and the write cycle counter 252. In this event, the programming voltage circuit 266 includes Vref plus a high voltage, and thus applies an increased programming voltage on the output V$_{pp}$. As a result, each write cycle of the next ten thousand write operations of the memory 28 are performed using the increased programming voltage V$_{pp}$.

A counter reset 268 is provided between the comparator 260 and the write cycle counter 252. The counter reset 268 is operative to reset the write cycle counter 252 for counting groups of ten thousand write cycles. In this manner, the programming voltage circuit 266 is capable of increasing the programming voltage a predefined amount for each group of ten thousand write cycles. The programming voltage circuit 266 may include a counter for counting the groups of ten thousand write cycles, by counting the number of signals output by the comparator 260.

For example, during the first ten thousand write cycles, circuit 270 is operative to provide the normal programming voltage on the V$_{pp}$ output. After the first ten thousand write cycles have been completed, control of the programming voltage is transferred to circuit 272 which provides an increased programming voltage on V$_{pp}$. The programming voltage output by circuit 270 is then deactivated. This process can continue to the Nth group of ten thousand write cycles, where circuit 274 provides the highest programming voltage on output Vpp. With the construction, the programmable life of the EEPROM memory 28 is increased with successive increases in the programming voltage. Experimental results has shown that a ten percent increase in the programming voltage every ten thousand write cycles provides an adequate voltage increase to assure the reliable storage of data within the memory cells.

It can be seen from the foregoing that there is disclosed a circuit for extending the programmable life of an EEPROM memory. Specifically, after each externally generated write operation, there is provided an automatic internal read operation which compares the data actually written, with that input to the memory. An added degree of assurance is provided by executing the internally generated read operation with an increased sense voltage. Thus, if the bits read from the memory cells just previously written pass muster when compared against the increased sense voltage, the externally generated write cycle is terminated. Provisions are also made for automatically executing an internally generated write operation if the internally generated read indicates that the stored data bits resulting from the external write are not identical to the data bits input to the memory. The internally generated write operation is conducted with an increased programming voltage such that the correct storage of data is assured in the deteriorated memory cells.

While the preferred embodiment of the method and apparatus have been disclosed with reference to specific signals, logic gate elements, and memory elements or the like, it is to be understood that many changes in detail may be made as a matter of engineering choice without departing from the scope of the invention as defined by the appended claims. Indeed, those skilled in the art may prefer to embody the circuitry in other forms, and in light of the present description the choice will be easy to implement. For example, the programming reference voltage and sense voltage resistor dividers could be replaced with band gap transistors. Also, it is not necessary to adopt all of the various advantageous features of the present disclosure. For example, in some applications it may be desirable to perform the automatically generated internal read operation without increasing the sense voltage.

What is claimed is:

1. A method of extending the programmable life of a read/write memory of the type having memory cells, said memory cells having a capacity for storing voltage which deteriorates in response to the writing of information therein, comprising the steps of:
   determining the amount of deterioration of a stored voltage for a memory cell; and
   thereafter increasing the voltage which is utilized for storing voltage in the deteriorated memory cell.

2. The method of claim 1 wherein said read/write memory is a floating gate type MOS memory containing MOS transistors each having source/drain regions and a gate on a substrate, the method further comprising the step of increasing the voltage between the gate and the substrate during said storing operation.

3. The method of claim 1 and further including temporarily storing the information before each externally generated write operation, reading the memory cell after each said write operation and detecting whether the information actually stored in the memory cells matches the information temporarily stored.

4. The method of claim 3 and further including increasing said voltage applied to the memory in dependence upon the detection of a mismatch between the information actually written and the information temporarily stored.

5. The method of claim 4 and further including restoring said voltage after an internally generated rewrite operation to a level existing before detecting the mismatch.

6. The method of claim 5 wherein the reading and writing is conducted asynchronously with regard to the normal timing of the memory.

7. The method of claim 3 for use with a memory having a sense voltage for determining whether a zero or one has been stored in the cell, and further including increasing the sense voltage before executing the read operation.

8. The method of claim 1 and further including executing a predetermined number of write cycles before increasing the programming voltage.

9. The method of claim 1 and further comprising;
   writing the memory in response to an externally generated write signal;
   asynchronously executing a read operation to determine whether the information stored in connection with the write operation is valid;
   increasing the voltage on a determination that the information stored is invalid; and
   rewriting the information utilizing the increased programming voltage.

10. The method of claim 9 for use with a memory having a sense voltage for determining whether a zero or a one has been stored in the cell, and further including increasing the sense voltage before executing the read operation.

11. An extended life electrically erasable programmable read only memory, comprising:
    a plurality of cells for storing data in response to a write command and for recalling stored data in response to a read command;
    means for generating a variable programming voltage and for selectively coupling said programming voltage to said cells for the storage of data in said cells;
    detector means for detecting the incorrect storage of data in said cells;
    means responsive to said detector means for increasing said programming voltage;
    means for thereafter storing the data in said cells at said increased programming voltage.

12. The memory of claim 11 wherein said cells comprise MOS cells having a floating gate and source/drain regions in a substrate, and the programming voltage is applied between the gate and substrate.

13. The memory of claim 11 wherein data is stored in response to a write operation generated external to the memory, and wherein said detector means includes means for temporarily storing the data written into the cells, read means for generating a read of the memory cells previously written, and comparator means for comparing the data read with the data temporarily stored and providing match/mismatch indications.

14. The memory of claim 13 wherein said read means further includes means for asynchronously generating a memory read operation in response to the externally generated write operation.

15. The memory of claim 13 and further including internal write means responsive to an indication of a mismatch by said comparator for increasing the programming voltage and for generating a rewrite operation of the data temporarily stored.

16. The memory of claim 15 and further including signal means for providing a signal that an internally generated write operation is being executed.

17. The memory of claim 15 and further including timer means for asynchronously generating said internal write operation in response to the mismatch indication of said comparator.

18. The memory of claim 11 and further including a variable sense voltage supply for comparing the data read from the memory for determining whether a digital one or a digital zero was stored, and means responsive to an externally generated write operation for increasing the sense voltage.

19. Circuitry for extending the programmable life of an EEPROM memory of the type having a plurality of floating gate storage cells, comprising:
    means for writing data into the cells of the memory in response to an externally generated write command;
    means for reading data from the cells of the memory in response to an externally generated read command;
    means responsive to said write command for temporarily storing the data to be written in the memory cells while also writing said data into said memory cells in response to the external write command;
    said means for reading including means for generating a variable sense voltage for use in determining whether data read from the memory cells is a one or a zero;
    means for increasing the sense voltage and for reading the memory cells which were written in response to said external write command;
    means for comparing the data temporarily stored with the data read as a result of the internal read operation, and for providing match and mismatch indications thereof;
    means for applying a variable programming voltage to said cells; and means for increasing the programming voltage and means for writing the temporarily stored data into said memory cells in response to a mismatch indication from said comparing means.

20. The circuit of claim 19 further including means for asynchronously generating the internal read and write operations in response to the external write command.

21. The circuit of claim 19 further including means for restoring the programming voltage after the completion of said internal write operation.

* * * * *